(12) United States Patent
Lee et al.

(10) Patent No.: US 6,356,123 B1
(45) Date of Patent: Mar. 12, 2002

(54) NON-INTEGER FREQUENCY DIVIDER (75) Inventors: Shan-Shan Lee, Kaohsiung Hsien; Jyhfong Lin, Taipei, both of (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/638,171

(22) Filed: Aug. 11, 2000

(30) Foreign Application Priority Data

Oct. 13, 1999 (TW) .......................................... 88117662

(51) Int. Cl.[7] ............................................... H03K 21/00
(52) U.S. Cl. ........................ 327/115; 327/117; 377/48; 377/122; 331/51; 708/103
(58) Field of Search .................................. 327/113, 114, 327/115, 117, 236, 237, 254, 218, 238; 377/47, 48, 108, 52, 124, 122; 331/57, 51; 708/101, 103

(56) References Cited

U.S. PATENT DOCUMENTS 3,571,728 A * 3/1971 Andrea ......................... 377/48
3,789,304 A * 1/1974 May ............................ 377/130
4,866,741 A * 9/1989 Minuhin ....................... 377/48

* cited by examiner

*Primary Examiner*—Timothy P. Callahan
*Assistant Examiner*—Minh Nguyen
(74) *Attorney, Agent, or Firm*—J. C. Patents (57) ABSTRACT

A non-integer frequency divider that is capable of dividing an original clock frequency by a non-integer number into a desired target clock frequency. By this non-integer frequency divider, a phase-shifting circuit is first used to convert the original clock frequency into a predetermined number of phase-shifted versions of the original clock frequency with a predetermined phase difference. Then, a plurality of edge-triggered clock signal generators are used to generate a plurality of edge-triggered signals whose rising and falling edges are synchronized with the original clock frequency and its phase-shifted versions. Finally, a synthesis circuit is used to synthesize the edge-triggered signals into an output signal serving as the intended target clock frequency.

10 Claims, 6 Drawing Sheets

NON-INTEGER FREQUENCY DIVIDER

CROSS-REFERENCE TO RELATED APPLICATION

This application claims the priority benefit of Taiwan application serial no. 88117662, filed Oct. 12, 1999.

BACKGROUND OF THE INVENTION

1. Field of the Invention

This invention relates to a digital circuitry, and more particularly, to a non-integer frequency divider capable of converting an original clock frequency into a target clock frequency equal to the original clock frequency divided by a non-integer number. The non-integer frequency divider of the invention can be used, for instance, on a PC motherboard to produce a set of different clock frequencies to drive various components of different clock specifications on the motherboard, such as CPU, memory, and peripheral devices.

2. Description of Related Art

In a computer system, the CPU serves as the main control and computation unit. The operation of a CPU is driven by a clock signal whose frequency determines the speed of the CPU. On a PC motherboard, however, a number of clock signals of different frequencies might have to be provided to drive various components of different clock specifications on the motherboard, such as CPU, memory, and peripheral devices.

Presently, PC speeds are rated at 266 MHz, 300 MHz, 350 MHz, 400 MHz, 450 MHz, or higher. One problem to the use of these high-speed CPUs, however, is that other components on the motherboard, namely the memories and peripheral devices, are still operating at low clock frequencies. For this reason, when a high-speed CPU is used in conjunction with a low-speed memory unit or peripheral device, the motherboard should be capable of generating a number of different clock frequencies.

The CPU communicates with the peripheral device via a dedicated I/O bus architecture. By the ISA (Industry Standard Architecture) standard, the I/O bus is operated at 8.33 MHz, which is obtained by dividing the 66 MHz main memory clock signal by 8. The reason why this slow-speed architecture is still in use is that it allows compatibility with old ISA-based function cards.

Newer I/O bus architectures are faster in speed than ISA, but they are still slower than the main memory. The PCI (Peripheral Component Interconnect) architecture can operate at 33 MHz, which is half of the 66 MHz main memory clock signal.

Presently, PC motherboards typically utilize a PLL (phase-locked loop) circuit for the generation of the various required clock frequencies. If a first clock frequency is an integer submultiple of a second clock frequency, the first clock frequency can be easily generated by using a frequency divider to divide the second clock frequency. However, this may not always be the case. For example, the motherboard may require the use of the clock frequencies of 66 MHz, 100 MHz, and 133 MHz, of which the 100 MHz clock frequency is not an integer submultiple of 133 MHz, which would make the PLL circuit quite complex in structure.

For instance, the use of the AGP (Advanced Graphic Port) 4X circuitry requires the use of the clock frequencies of 266 MHz, 200 MHz, 133 MHz, 100 MHz, and 66 MHz. One scheme to obtain these clock frequencies is to generate an original clock frequency of 800 MHz and then divide this original clock frequency respectively by the integer numbers of 3, 4, 6, 8, and 12. One drawback to this scheme, however, is that it makes the PLL circuit quite complex in structure with huge power consumption.

SUMMARY OF THE INVENTION

The object of this invention is to provide a non-integer frequency divider, by which a target clock frequency can be obtained by dividing an original clock frequency by a non-integer number so that the above-mentioned set of clock frequencies of 266 MHz, 200 MHz, 133 MHz, 100 MHz, and 66 MHz can be obtained, for example, by dividing an original clock frequency of 400 MHz by the non-integer and integer numbers of 1.5, 2, 3, 4, and 6.

Another object of this invention is to provide a non-integer frequency divider which is less complex in circuit structure than prior art for the generation of a set of different clock frequencies.

Yet another object of this invention is to provide a non-integer frequency divider which consumes less power and is less sensitive to the noise than prior art.

In accordance with the foregoing and other objectives, the invention proposes a new non-integer frequency divider. The non-integer frequency divider of the invention is designed to convert an original clock frequency into a target clock frequency equal to the original clock frequency divided by a non-integer number. To do this, the original clock should be first phase-shifted into a predetermined number of phase-shifted versions of the original clock with a predetermined phase difference. Then, a plurality of edge-triggered clock signal generators are used to receive the original clock and its phase-shifted versions as input signals for generating responsively a plurality of edge-triggered signals which are synchronized in rising and falling edges with the original clock frequency and its phase-shifted versions.

Next, a synthesis circuit is used to receive the edge-triggered signals as input signals for synthesizing the edge-triggered signals into an output signal serving as the intended target clock. The synthesis circuit includes: a set of XOR gates, each receiving two of the edge-triggered signals from the plurality of edge-triggered clock signal generators as input signals, for performing an XOR logic operation on each set of two received edge-triggered signals to thereby generate a set of duty-cycle signals and an OR gate having a set of input ends. Each input end is connected to the output port of each of the XOR gates, for performing an OR logic operation on the received duty-cycle signals from the XOR gates, with its output serving as the intended target clock.

With the non-integer frequency divider of the invention, a 266 MHz clock frequency can be obtained by dividing an original clock frequency of 400 MHz (rather than 800 MHz as in the case of the prior art) by a non-integer number of 1.5, while the clock frequencies of 200 MHz, 133 MHz, 100 MHz, and 66 MHz can still be obtained by dividing the 400 MHz frequency by the integer numbers of 2, 3, 4, and 6. Therefore, the invention allows the required PLL circuitry to be less complex in structure, less power-consuming, and less susceptible to external noise.

The invention can be realized by using an oscillator capable of generating the original clock and the shifted versions of the original clock frequency. In this case, the non-integer frequency divider further includes a first edge-triggered clock signal generator, which is capable of being triggered by the original clock frequency to thereby generate a first positive edge-triggered signal and a first negative edge-triggered signal; a second edge-triggered clock signal generator, which is capable of being triggered by the shifted version of the original clock frequency to thereby generate a second positive edge-triggered signal and a second negative edge-triggered signal; and a synthesis circuit for synthesizing the first and second positive edge-triggered signals and the first and second negative edge-triggered signals into an output signal serving as the intended target clock frequency.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
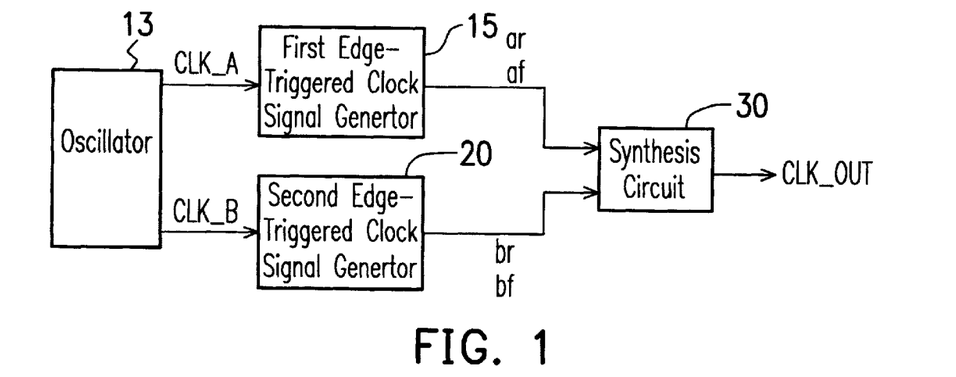
FIG. 1 is a schematic block diagram of a first preferred embodiment of the invention based on an oscillator.

FIG. 1 is a schematic block diagram of a first preferred embodiment of the non-integer frequency divider of the invention based on an oscillator. The non-integer frequency divider of the invention is capable of converting an original clock frequency into a target clock frequency which is a non-integer submultiple of the original clock frequency. In this embodiment, for example, the non-integer frequency divider of the invention is used to generate a set of different clock frequencies including 266 MHz, 200 MHz, 133 MHz, 100 MHz, and 66 MHz by dividing an original clock frequency of 400 MHz by the non-integer and integer numbers of 1.5, 2, 3, 4, and 6.

As shown, the first preferred embodiment of the non-integer frequency divider of the invention includes an oscillator 13, a first edge-triggered clock signal generator 15, a second edge-triggered clock signal generator 20, and a synthesis circuit 30. The oscillator 13 is designed to generate an original clock frequency and at least one phase-shifted version of the original clock frequency. In the case of dividing 400 MHz by 3/2, for example, the oscillator 13 is used to generate an original clock frequency of 400 MHz as well as a 90°-shifted version of the original clock frequency, while in the case of dividing by 4/3, the oscillator 13 is used to generate an original clock frequency as well as a 60°-shifted version and a 120°-shifted version of the original clock frequency.

The original clock frequency CLK_A is sent to the first edge-triggered clock signal generator 15, while the 90°-shifted version CLK_B is sent to the second edge-triggered clock signal generator 20. In response, the first edge-triggered clock signal generator 15 outputs a first set of edge-triggered signals to the synthesis circuit 30, while the second edge-triggered clock signal generator 20 outputs a second set of edge-triggered signals to the synthesis circuit 30. At the synthesis circuit 30, the first set of edge-triggered signals and the second set of edge-triggered signals are synthesized into an output clock signal CLK_OUT serving as the intended target clock frequency.

Figure 2:
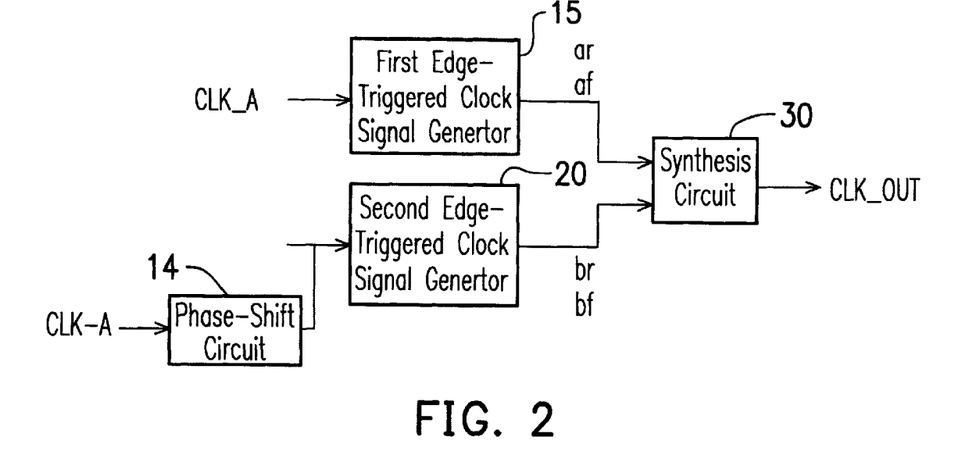
FIG. 2 is a schematic block diagram of a second preferred embodiment of the invention based on a phase-shift circuit.

FIG. 2 is a schematic block diagram of a second preferred embodiment of the invention which is based on a phase-shift circuit. This embodiment differs from the previous one shown in FIG. 1 particularly in that a phase-shift circuit 14 is used to replace the oscillator 13 shown in FIG. 1, which receives an input clock signal and generates a set of phase-shifted versions of the input clock signal. The input clock frequency is sent directly to the first edge-triggered clock signal generator 15, while the phase-shifted version of the input clock frequency from the phase-shift circuit 14 is sent to the second edge-triggered clock signal generator 20.

Figure 3:
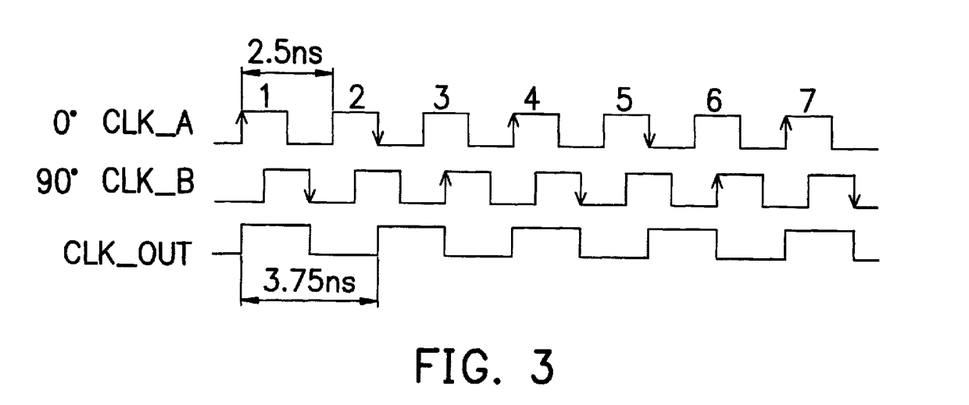
FIG. 3 is a signal diagram used to depict the timing relationship between the original clock frequency and the resultant target clock frequency from the invention.

FIG. 3 is a signal diagram used to depict the timing relationship between the original clock frequency CLK_A and the resultant target clock frequency CLK_OUT through the use of the invention in the case of the original clock frequency CLK_A being 400 MHz and the target clock frequency CLK_OUT being 266 MHz. In this case, the original clock frequency CLK_A has a period of 2.5 ns (nanosecond), while the target clock frequency CLK_OUT has a period of 3.75 ns. The phase-shifted version CLK_B of the original clock frequency CLK_A also has a period of 2.5 ns but is phase-shifted by 90° with respect to the original clock frequency CLK_A.

Figure 4:
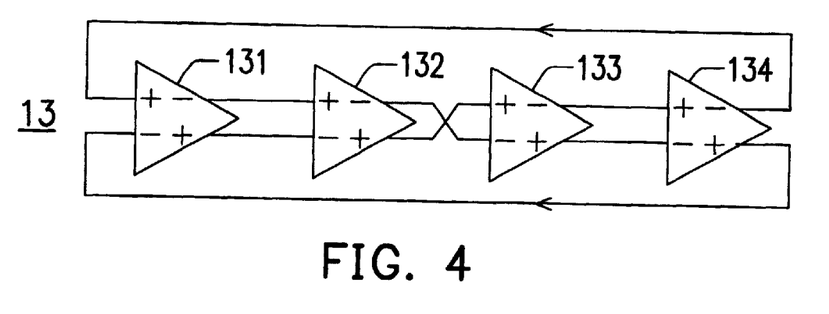
FIG. 4 is a schematic circuit diagram showing the internal structure of the oscillator utilized in the non-integer frequency divider of the invention shown in FIG. 1.

FIG. 4 is a schematic diagram showing the internal structure of the oscillator 13 in the case of 3/2 frequency division. As shown, the oscillator 13 includes a number of four cascaded phase inverters 131, 132, 133, 134, each of which is capable of providing a 180° phase shift to the input frequency. Thus, the total phase shift provided by these four inverters 131, 132, 133, 134 is 720°. To allow oscillation, however, the total phase shift, which is the multiple of 360°, is 1080°, and therefore, the four phase inverters 131, 132, 133, 134 should each further provide an additional phase shift of 90°.

In the case of 4/3 frequency division where a 60°-shifted version and a 120°-shifted version of the original clock frequency are required, only three phase inverters are required in the oscillator 13. In this case, the three cascaded phase inverters can provide a total phase shift of 540°, with each further providing an additional phase shift of 60° to allow oscillation. The 60°-shifted version of the original clock frequency can be obtained from the output port of the first phase inverter, while the 120°-shifted version can be obtained from the output port of the second phase inverter.

Figure 5:
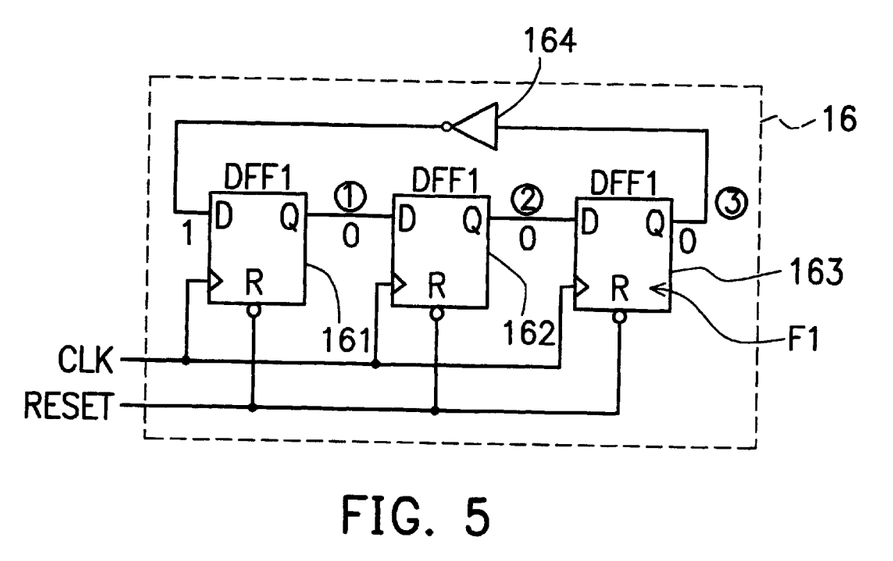
FIG. 5 is a schematic circuit diagram showing the internal structure of a positive edge-triggered ring counter utilized in the non-integer frequency divider of the invention.
Figure 9:
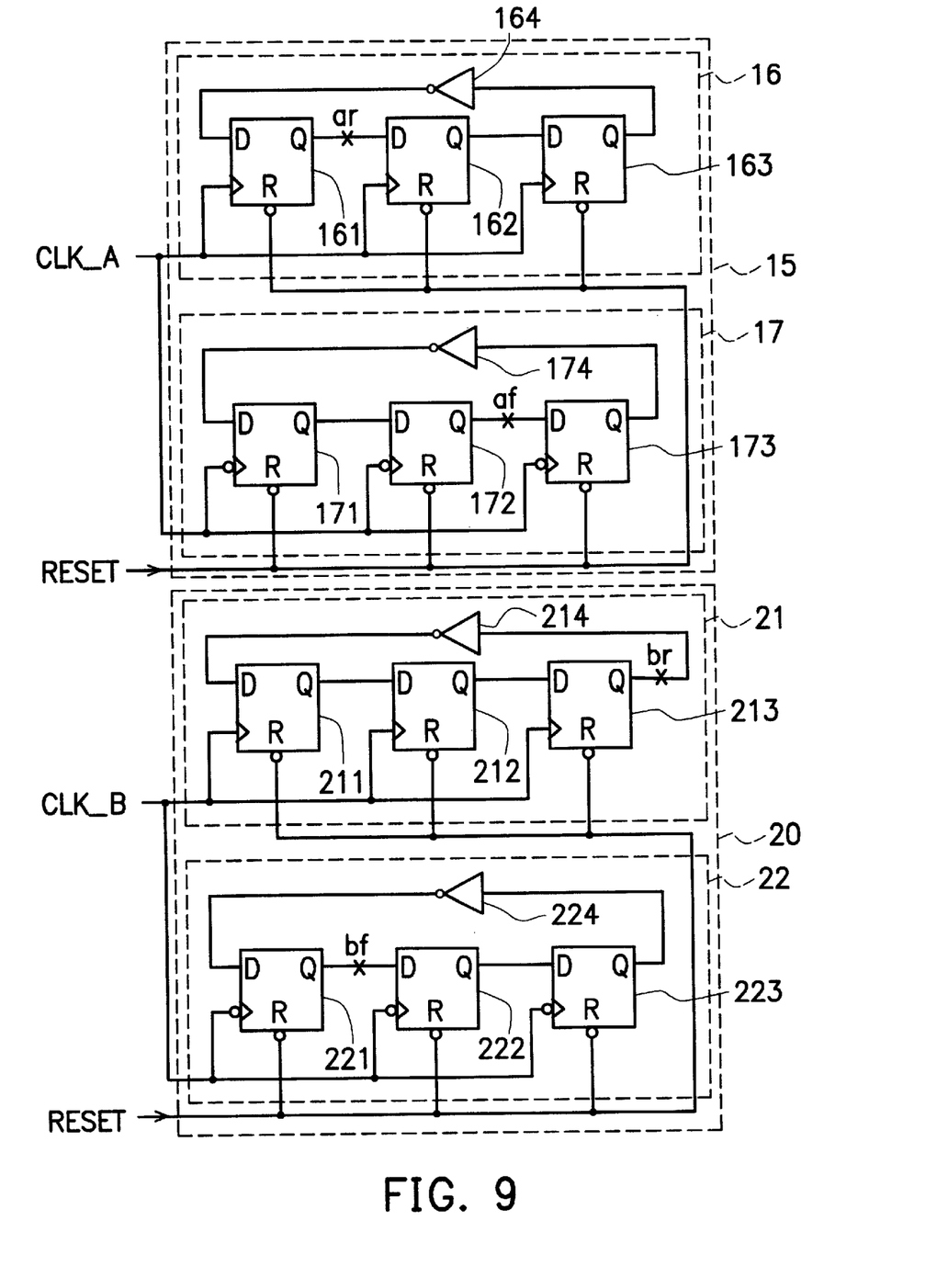
FIG. 9 is a schematic circuit diagram showing the internal structure of the first and second edge-triggered clock signal generators utilized in the non-integer frequency divider of the invention.

FIG. 5 is a schematic circuit diagram showing the internal structure of a rising edge-triggered ring counter 16 which serves as a constituent part of the first and second edge-triggered clock signal generators 15, 20 (shown in FIG. 9). As shown, the rising edge-triggered ring counter 16 includes three positive D-type flip-flops: a first rising D-type flip-flop 161, a second positive D-type flip-flop 162, a third positive D-type flip-flop 163, and an inverter 164. These three positive D-type flip-flops 161, 162, 163 are cascaded in such a manner that each has its Q-port connected to the D-port of the next stage, the first one has its D-port connected to the output end of the inverter 164, and the last one has its Q-port connected to the input end of the inverter 164. The output of the first positive D-type flip-flop 161 is denoted by ①, the output of the second positive D-type flip-flop 162 is denoted by ②, and the output of the third positive D-type flip-flop 163 is denoted by ③. This arrangement allows the positive edge-triggered ring counter 16 to serve as a divide-by-6 frequency divider as explained in the following.

Figure 6:
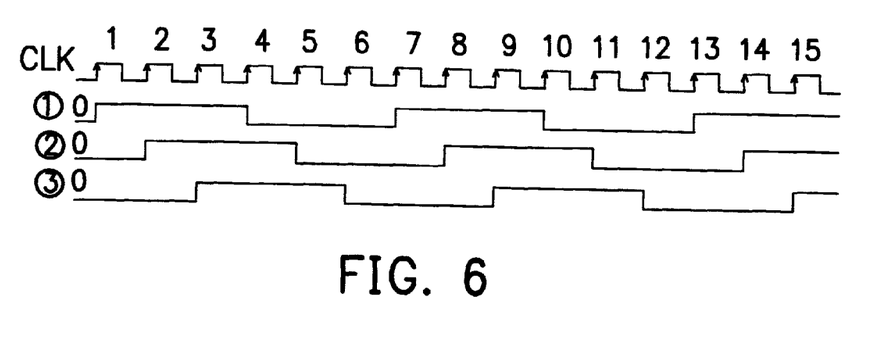
FIG. 6 is a signal diagram showing the timing relationship between an input clock frequency and three resultant edge-triggered signals from the positive edge-triggered ring counter of FIG. 5.

FIG. 6 is a signal waveform diagram showing the timing relationship of the output signals ①, ②, ③ with respect to the clock signal CLK. Initially, the output signals ①, ②, ③ from the respective Q-ports of the three positive D-type flip-flops 161, 162, 163 are all at LOW state (representing bit 0). At the appearance of the rising edge (i.e., the positive-going edge) of the first pulse in CLK, the output signal ① from the Q-port of the first positive D-type flip-flop 161 is triggered to a HIGH state. Subsequently, at the appearance of the rising edge of the second pulse in CLK, the output signal ② from the Q-port of the second positive D-type flip-flop 162 is raised to the HIGH state. Finally, at the appearance of the rising edge of the third pulse in CLK, the output signal ③ from the Q-port of the third positive D-type flip-flop 163 is raised to the HIGH state. The output signal ③ from the Q-port of the third positive D-type flip-flop 163 is then inverted by the inverter 164 into a LOW state and transferred back to the D-port of the first positive D-type flip-flop 161. As a result, the output signal ① from the Q-port of the first positive D-type flip-flop 161 remains at the LOW state for the next three pulses in CLK. The output signals ①, ②, ③ are therefore each a divide-by-6 version of the clock frequency CLK.

Figure 7:
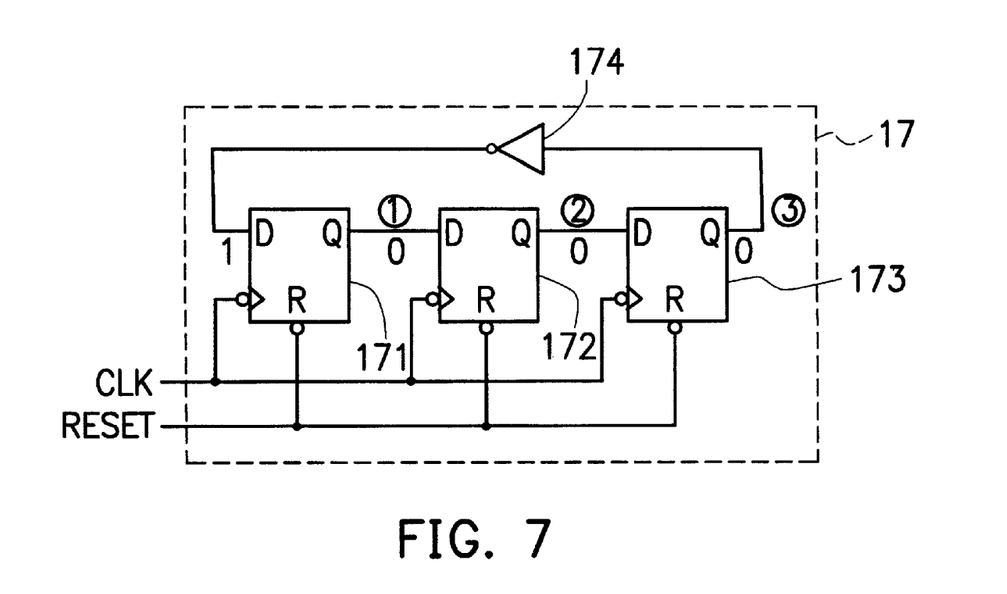
FIG. 7 is a schematic circuit diagram showing the internal structure of a negative edge-triggered ring counter utilized in the non-integer frequency divider of the invention.

FIG. 7 is a schematic circuit diagram showing the internal structure of a negative edge-triggered ring counter 17 which serves as a constituent part of the first and second edge-triggered clock signal generators 15, 20 (shown in FIG. 9). As shown, the negative edge-triggered ring counter 17 includes a first negative D-type flip-flop 171, a second negative D-type flip-flop 172, a third negative D-type flip-flop 173, and an inverter 164, which are configured in substantially the same manner as the positive edge-triggered ring counter 16 shown in FIG. 5. The output of the first negative D-type flip-flop 171 is denoted by ①, the output of the second negative D-type flip-flop 172 is denoted by ②, and the output of the third negative D-type flip-flop 173 is denoted by ③. This arrangement allows the negative edge-triggered ring counter 17 to serve as a divide-by-6 frequency divider as explained in the following.

Figure 8:
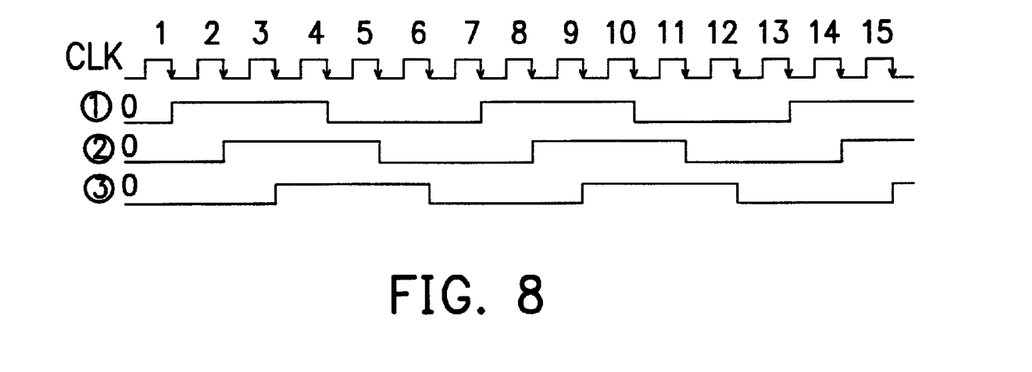
FIG. 8 is a signal diagram showing the timing relationship between an input clock frequency and three resultant edge-triggered signals from the negative edge-triggered ring counter of FIG. 7.

FIG. 8 is a signal waveform diagram showing the timing relationship of the output signals ①, ②, ③ with respect to the clock signal CLK. Initially, the output signals ①, ②, ③ from the respective Q-ports of the three negative D-type flip-flops 171, 172, 173 are all at LOW state (representing bit 0). At the appearance of the falling edge (i.e., negative-going edge) of the first pulse in CLK, the output signal ① from the Q-port of the first negative D-type flip-flop 171 is raised to a HIGH state. Subsequently, at the appearance of the falling edge of the second pulse in CLK, the output signal ② from the Q-port of the second negative D-type flip-flop 172 is raised to the HIGH state. Finally, at the appearance of the falling edge of the third pulse in CLK, the output signal ③ from the Q-port of the third negative D-type flip-flop 173 is raised to the HIGH state. The output signal ③ from the Q-port of the third negative D-type flip-flop 173 is then inverted by the inverter 174 into LOW state and transferred back to the D-port of the first negative D-type flip-flop 171. As a result, the output signal ① from the Q-port of the first negative D-type flip-flop 171 remains at the LOW state for the next three pulses in CLK. The output signals ①, ②, ③ are therefore each a divide-by-6 version of the clock frequency CLK.

FIG. 9 is a schematic circuit diagram showing the incorporation of the positive edge-triggered ring counter of FIG. 5 and the negative edge-triggered ring counter of FIG. 7 in the first and second edge-triggered clock signal generators 15, 20. As shown, the first edge-triggered clock signal generator 15 includes a positive edge-triggered ring counter 16 and a negative edge-triggered ring counter 17, while the second edge-triggered clock signal generator 20 also includes a positive edge-triggered ring counter 21 and a negative edge-triggered ring counter 22. The positive edge-triggered ring counters 16, 21 are structured as FIG. 5, while the negative edge-triggered ring counters 17, 22 are structured as FIG. 7. In the case of 3/2 frequency division, the positive edge-triggered ring counter 16 and the negative edge-triggered ring counter 17 are both clocked by the original clock frequency CLK_A, while the positive edge-triggered ring counter 21 and the negative edge-triggered ring counter 22 are both clocked by the 90°-shifted version CLK_B of the original clock frequency CLK_A.

From the first edge-triggered clock signal generator 15, two edge-triggered signals ar, af are obtained, of which the ar signal is obtained from the Q-port of the first positive D-type flip-flop 161 in the positive edge-triggered ring counter 16, while the af signal is obtained from the Q-port of the second negative D-type flip-flop 172 in the negative edge-triggered ring counter 17. Furthermore, from the second edge-triggered clock signal generator 20, two edge-triggered signals br, bf are obtained, of which the br signal is obtained from the Q-port of the third positive D-type flip-flop 213 in the positive edge-triggered ring counter 21, while the bf signal is obtained from the Q-port of the first negative D-type flip-flop 221 in the negative edge-triggered ring counter 22.

Figure 10:
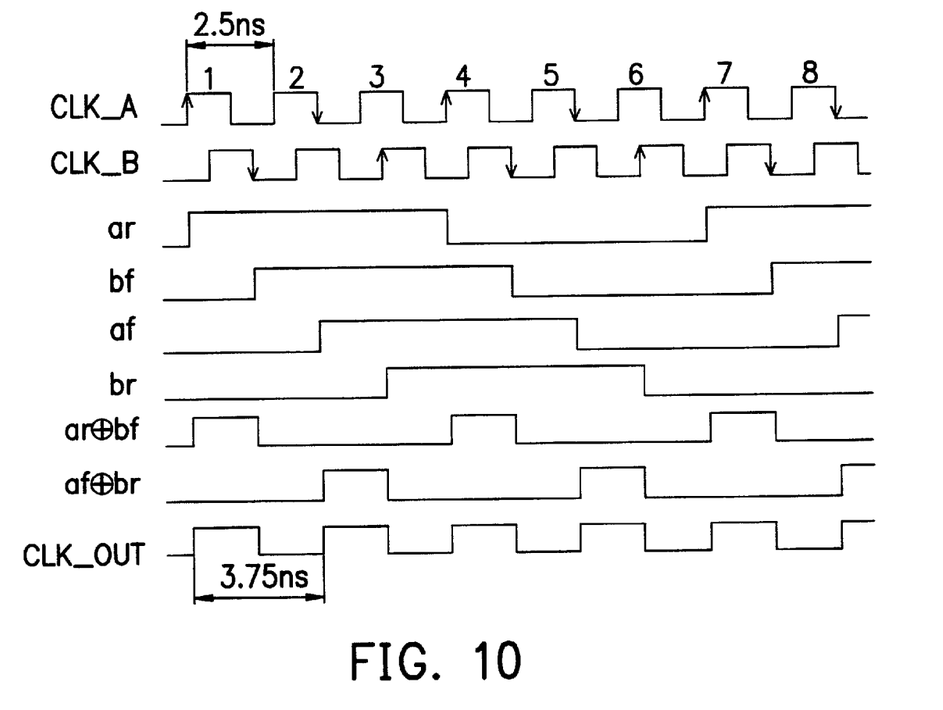
FIG. 10 is a signal diagram showing the timing relationship between the target clock frequency, the edge-triggered signals, and the original clock frequency through the use of the invention in the case of 3/2 frequency division.

FIG. 10 is a signal diagram showing the timing relationship between the target clock frequency CLK_OUT, the edge-triggered signals ar, af, br, bf and the clock frequencies CLK_A, CLK_B in the case of 3/2 frequency division. The CLK_A signal represents the original clock frequency of 400 MHz and the CLK_B signal represents the 90°-shifted version of the original clock frequency CLK_A. The edge-triggered signals ar, af, br, bf are each a divide-by-6 version of the original clock frequency CLK_A, but differ in phase from each other. The ar, bf, af, and br signals are transferred to the synthesis circuit 30 for further processing as described in the following.

Figure 11:
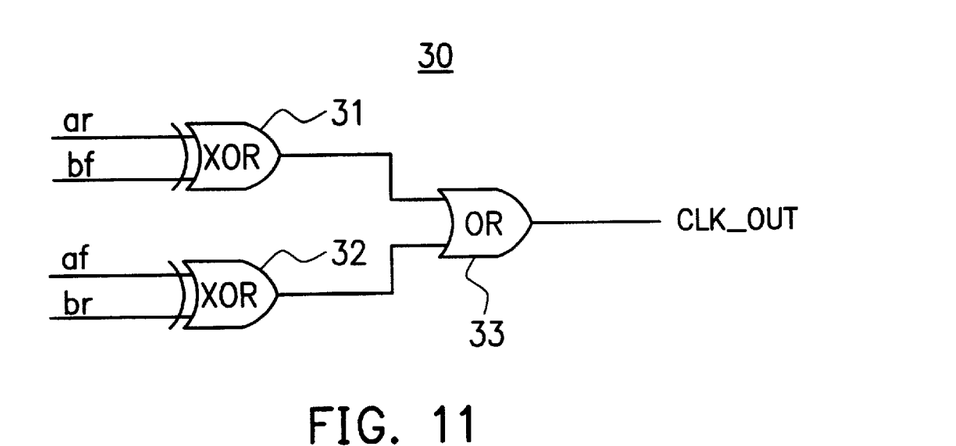
FIG. 11 is a schematic circuit diagram showing the internal structure of the synthesis circuit utilized in the non-integer frequency divider of the invention.

FIG. 11 is a schematic circuit diagram showing the internal structure of the synthesis circuit 30. As shown, the synthesis circuit 30 is composed of a first XOR gate 31, a second XOR gate 32, and an OR gate 33. The first XOR gate 31 is used to perform an XOR logic operation on the two edge-triggered signals (ar, bf) from the circuit of FIG. 9 (the output thereof is referred to as a first duty-cycle signal); while the second XOR gate 32 is used to perform an XOR logic operation on the two edge-triggered signals (af, br) from the circuit of FIG. 9 (the output thereof is referred to as a second duty-cycle signal). Subsequently, the OR gate 33 performs an OR logic operation on the output of the first XOR gate 31 and the output of the second XOR gate 32. In the case of the original clock frequency CLK_A being 400 MHz, the output of the OR gate 33 is a clock signal of 400/1.5=266 MHz, which then serves as the target clock frequency CLK_OUT.

Figure 12:
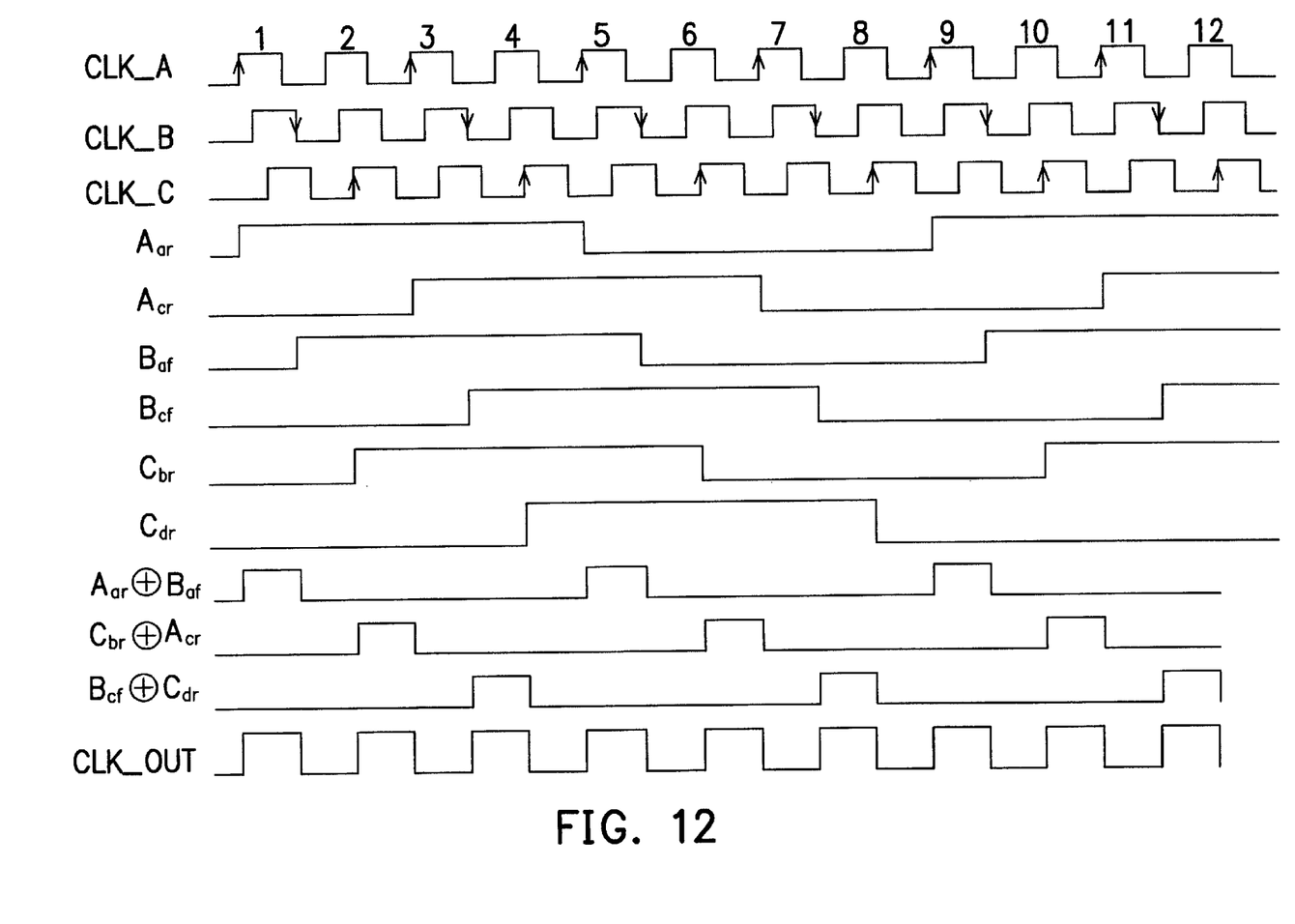
FIG. 12 is a signal diagram showing the timings relationship between the target clock frequency, the edge-triggered signals, the original clock frequency, and the phase-shifted versions of the original clock frequency in the case of 4/3 frequency division.

FIG. 12 is a signal diagram showing the timing relationship between the target clock frequency CLK_OUT, the edge-triggered signals $A_{ar}$, $A_{cr}$, $B_{af}$, $B_{cf}$, $C_{br}$, $C_{dr}$, the original clock frequency CLK_A, the 60°-shifted version CLK_B of the original clock frequency CLK_A, and the 120°-shifted version CLK_C of the original clock frequency CLK_A in the case of 4/3 frequency division. In this case, the oscillator 13 should be composed of three phase inverters to provide the 60°-shifted version CLK_B and the 120°-shifted version CLK_C of the original clock frequency CLK_A. The synthesis circuit 30 should be included with three XOR gates, respectively for performing a first XOR logic operation on the edge-triggered signals ($A_{ar}$, $A_{cr}$) resulting from the original clock frequency CLK_A, a second XOR logic operation on the edge-triggered signals ($B_{af}$, $B_{cf}$) resulting from the 60°-shifted version CLK_B of the original clock frequency CLK_A, and a third XOR logic operation on the edge-triggered signals ($C_{br}$, $C_{dr}$) resulting from the 120°-shifted version CLK_C of the original clock frequency CLK_A. An OR gate is then used to perform an OR logic operation on the output signals respectively from these three XOR gates to obtain the divide-by-4/3 target clock frequency CLK_OUT.

Generalization

Generally speaking, the non-integer frequency divider of the invention is capable of converting an original clock frequency into a target clock frequency equal to the original clock frequency divided by a non-integer number of m/n, where m and n are integer numbers and m>n. In the case of 3/2 frequency division, m=3 and n=2, and the original clock frequency should be phase-shifted by 360/2n=360/2*2=90° to obtain the 90°-shifted version as another input clock frequency. In the case of 4/3 frequency division, m=4 and n=3, and the original clock frequency should be phase-shifted by 360/2n=360/2*3=60° to obtain the 60°-shifted version and the 120°-shifted version as other input clock frequencies.

Broadly defined, the non-integer frequency divider of the invention comprises the following constituent parts: a phase-shifting means for converting the original clock frequency into a predetermined number of phase-shifted versions of the original clock frequency with a phase difference of 360°/2n; a plurality of edge-triggered clock signal generators, receiving the original clock frequency and its phase-shifted versions as input signals, for generating responsively a plurality of edge-triggered signals each having a period of 2m and being synchronized in rising and falling edges with the original clock frequency and its phase-shifted versions; and a synthesis circuit, receiving the edge-triggered signals as input signals, for synthesizing the edge-triggered signals into an output signal serving as the intended target clock frequency.

The synthesis circuit includes: a set of n XOR gates, each receiving two of the edge-triggered signals from the plurality of edge-triggered clock signal generators as input signals, for performing an XOR logic operation on each set of two received edge-triggered signals to thereby generate a set of n duty-cycle signals and an OR gate having a set of n input ends. Each end is connected to the output port of each of the XOR gates, for performing an OR logic operation on the received n duty-cycle signals from the n XOR gates, with its output serving as the intended target clock frequency.

The plurality of edge-triggered clock signal generators each include: a plurality of positive edge-triggered ring counters and a plurality of negative edge-triggered ring counters, which are combined for the generation of the edge-triggered signals.

The positive edge-triggered ring counters each include: an inverter and a set of m positive D-type flip-flops which are cascaded in such a manner that each has its Q-port connected to the D-port of the next. The first one has its D-port connected to the output end of the inverter and the last one has its Q-port connected to the input end of the inverter.

The negative edge-triggered ring counters each include: an inverter and a set of m negative D-type flip-flops which are cascaded in such a manner that each has its Q-port connected to the D-port of the next. The first one has its D-port connected to the output end of the inverter and the last one has its Q-port connected to the input end of the inverter.

Conclusion

In conclusion, the invention provides a non-integer frequency divider which is capable of converting an original clock frequency into a target clock frequency equal to the original clock frequency divided by a non-integer number. With the invention, a 266 MHz clock frequency can be obtained by dividing an original clock frequency of 400 MHz (rather than 800 MHz as in the case of the prior art) by a non-integer number of 1.5, while the clock frequencies of 200 MHz, 133 MHz, 100 MHz, and 66 MHz can still be obtained by dividing the 400 MHz frequency by the integer numbers of 2, 3, 4, and 6. With the use of the 400 MHz clock frequency instead of 800 MHz, the invention allows the required PLL circuitry to be less complex in structure, less power-consuming, and less susceptible to external noise. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A non-integer frequency divider for dividing an original clock into a target clock by a non-integer number of m/n, where m and n are integer numbers and m>n, the non-integer frequency divider comprising:

a phase-oscillating device for converting the original clock into a predetermined number of phase-shifted versions of the original clock with a phase difference of 360°/2n;

a plurality of edge-triggered clock signal generators, each edge-triggered clock signal generator receiving the original clock or a corresponding phase-shifted version for generating responsively a plurality of edge-triggered signals, each of the edge-triggered signals having a period of 2m times of that of the original clock and respectively having a rising edge or a falling edge synchronized with a rising edge or a falling edge of the signal input to the edge-triggered clock signal generator; and a synthesis circuit, receiving the edge-triggered signals from the plurality of edge-trimmed clock signal generator, for synthesizing the edge-triggered signals into the target clock.

2. The non-integer frequency divider of claim 1, wherein the synthesis circuit includes:

n XOR gates, each receiving two of the edge-triggered signals from the plurality of edge-triggered clock signal generators as input signals, for performing an XOR logic operation on each set of the two received edge-triggered signals to thereby generate n duty-cycle signals; and an OR gate having n input terminals, each terminal being connected to one of the output port of the XOR gates, for performing an OR logic operation on the n duty-cycle signals from the XOR gates, to produce an output as the target clock.

3. The non-integer frequency divider of claim 1, wherein each edge-triggered clock signal generator includes:

a plurality of positive edge-triggered ring counters and a plurality of negative edge-triggered ring counters, which are combined for generating the edge-triggered signals.

4. The non-integer frequency divider of claim 3, wherein the positive edge-triggered ring counters each include:

an inverter; and m positive D-type flip-flops which are cascaded in such a manner that each has its Q-port connected to the D-port of the next stage, the first flip-flop has its D-port connected to the output end of the inverter and the last flip-flop has its Q-port connected to the input end of the inverter.

5. The non-integer frequency divider of claim 3, wherein the negative edge-triggered ring counters each include:

an inverter; and m negative D-type flip-flops which are cascaded in such a manner that each has its Q-port connected to the D-port of the next stage, the first flip-flop has its D-port connected to the output end of the inverter, and the last flip-flop has its Q-port connected to the input end of the inverter.

6. A non-integer frequency divider for dividing an original clock into a target clock by a non-integer number of 3/2, the non-integer frequency divider comprising:

a phase-oscillating device for converting the original clock into a 90°-shifted version of the original clock;

a first edge-triggered clock signal generator, triggered by the original clock to generate a first positive edge-triggered signal and a first negative edge-triggered signal;

a second edge-triggered clock signal generator, triggered by the 90°-shifted version of the original clock to generate a second positive edge-triggered signal and a second negative edge-triggered signal; and a synthesis circuit for synthesizing the first and second positive edge-triggered signals and the first and second negative edge-triggered signals into the target clock.

7. The non-integer frequency divider of claim 6, wherein the first edge-triggered clock signal generator includes a first positive edge-triggered ring counter and a first negative edge-triggered ring counter which are both clocked by the original clock; and the second edge-triggered clock signal generator includes a second positive edge-triggered ring counter and a second negative edge-triggered ring counter which are both clocked by the 90°-shifted version of the original clock.

8. The non-integer frequency divider of claim 7, wherein each of the first and the second positive edge-triggered ring counter includes:

an inverter; and 3 positive D-type flip-flops, which are all clocked by the original clock, and which are cascaded in such a manner that each has its Q-port connected to the D-port of the next stage, the first flip-flop has its D-port connected to the output end of the inverter, and the last flip-flop has its Q-port connected to the input end of the inverter.

9. The non-integer frequency divider of claim 7, wherein the first and second negative edge-triggered ring counters each include:

an inverter; and 3 negative D-type flip-flops, which are all clocked by the 90°-shifted version of the original clock, and which are cascaded in such a manner that each has its Q-port connected to the D-port of the next stage, the first flip-flop has its D-port connected to the output end of the inverter, and the last flip-flop has its Q-port connected to the input end of the inverter.

10. The non-integer frequency divider of claim 6, wherein the synthesis circuit includes:

a first XOR gate for performing an XOR logic operation on the first positive edge-triggered signal and the second negative edge-triggered signal to thereby generate a first duty-cycle signal;

a second XOR gate for performing an XOR logic operation on the first negative edge-triggered signal and the second positive edge-triggered signal to thereby generate a second duty-cycle signal; and an OR gate for performing an OR logic operation on the first and second duty-cycle signals with its output serving as the target clock.

* * * * *